United States Patent
Park et al.

(10) Patent No.: US 7,953,131 B2
(45) Date of Patent: May 31, 2011

(54) FREQUENCY SYNTHESIZER AND FREQUENCY SYNTHESIZING METHOD USING OPTICAL INJECTION LOCKING

(75) Inventors: Sang Eon Park, Daejeon (KR); Han Seb Moon, Daejeon (KR); Eok Bong Kim, Daejeon (KR); Chang Young Park, Daejeon (KR); Taeg Yong Kwon, Daejeon (KR)

(73) Assignee: Korea Research Institute of Standards and Science (KR)

( * ) Notice: Subject to any disclaimer, the term of this patent is extended or adjusted under 35 U.S.C. 154(b) by 42 days.

(21) Appl. No.: 12/421,444

(22) Filed: Apr. 9, 2009

(65) Prior Publication Data

US 2009/0225795 A1    Sep. 10, 2009

Related U.S. Application Data

(63) Continuation of application No. PCT/KR2007/004848, filed on Oct. 4, 2007.

(30) Foreign Application Priority Data

Oct. 11, 2006  (KR) .................. 10-2006-0098825

(51) Int. Cl.
*H01S 3/10* (2006.01)
(52) U.S. Cl. .............. 372/28; 372/18; 372/25
(58) Field of Classification Search .......... 372/18, 372/28
See application file for complete search history.

(56) References Cited

U.S. PATENT DOCUMENTS

2003/0231601 A1* 12/2003 Kim ................... 370/277

OTHER PUBLICATIONS

J. Jin et al., "Absolute length calibration of gauge blocks using optical comb of a femtosecond pulse laser", Optics Express, vol. 14, Issue 13, pp. 5968-5974 (2006).*

* cited by examiner

*Primary Examiner* — Minsun Harvey
*Assistant Examiner* — Xnning Niu
(74) *Attorney, Agent, or Firm* — Park & Associates IP Law, P.C.

(57) ABSTRACT

The present invention relates to an optical frequency synthesizer and an optical frequency synthesizing method using femtosecond laser optical injection locking, which inject a femtosecond laser optical frequency comb into a diode laser, thus obtaining single-mode laser light, phase-locked to only a single mode in the optical frequency comb, and which change the optical frequency and interval, that is, the repetition rate, of a femtosecond laser, together with the frequency of a semiconductor laser, thus scanning optical frequencies while realizing a single desired optical frequency. The optical frequency synthesizer using femtosecond laser optical injection locking, includes a mode-locked femtosecond laser (110), which is a master laser, and a diode laser (120), which is a slave laser and into which laser light emitted from the femtosecond laser is injected.

13 Claims, 5 Drawing Sheets

FREQUENCY SYNTHESIZER AND FREQUENCY SYNTHESIZING METHOD USING OPTICAL INJECTION LOCKING

REFERENCE TO RELATED APPLICATIONS

This a continuation of pending International Patent Application PCT/KR2007/004848 filed on Oct. 4, 2007, which designates the United States and claims priority of Korean Patent Application No. 10-2006-0098825 filed on Oct. 11, 2006, the entire contents of which are incorporated herein by reference.

FIELD OF THE INVENTION

The present invention relates to an optical frequency synthesizer and optical frequency synthesizing method using femtosecond laser optical injection locking.

BACKGROUND OF THE INVENTION

Technology for the absolute measurement of optical frequency is essentially required in the age of optical Internet-based information communication. When the wavelength or the frequency, of light used in optical communication can be precisely measured, the wavelength can be finely split to a desired degree. This enables transmission based on Dense Wavelength Division Multiplexing (DWDM), in which multiple wavelengths are divided and separately carried on a single optical fiber. Such a method denotes an optical transmission method in which multiple optical wavelengths are simultaneously transmitted through a single optical fiber. In a typical optical fiber, four-wavelength multiplexing is performed on a system having a transfer rate of 2.5 Gbps per wavelength, and a transfer rate of 10 Gbps is provided, but, in the DWDM, a maximum of about 80 optical wavelengths is simultaneously multiplexed, and thus a transfer rate of about 400 Gbps can be achieved.

Recently, optical frequency measurement technology has met a new turning point because the absolute measurement of optical frequency has become possible, as a femtosecond mode-lock laser for generating a femtosecond pulse ($1/10^{15}$ second), the time duration of which is very short in a time domain, is used.

Optical injection locking is a method of locking the phase of a slave laser, having a wide frequency bandwidth and inferior spectrum characteristics, to the phase of a master laser, having a narrow frequency bandwidth and excellent spectrum characteristics, without requiring an electronic device.

A femtosecond laser is characterized by an optical frequency comb, in which the repetition rate of extremely short pulses in the time domain is identical to the frequency interval in the frequency domain. Recently, with the development of $f_{ceo}$ (carrier-envelope-offset frequency) stabilization technology, the absolute measurement of optical frequency using a femtosecond laser becomes possible. This enables the development of a more precise optical frequency standard than a Cesium atomic fountain clock, which is well known to be the most precise clock at the present time, while providing an opportunity to extend the optical frequency standard from the microwave range, such as an atomic clock, up into the optical frequency range without change. However, such technology is disadvantageous in that the frequency of a femtosecond laser comb has been defined, but it is still difficult to select only a single mode and form a single-mode laser having a desired frequency, or to scan the frequency, and in that the optical frequency synthesizers that have been developed to date are very complicated.

SUMMARY OF THE INVENTION

Accordingly, the present invention has been made keeping in mind the above problems occurring in the prior art, and an object of the present invention is to provide an optical frequency synthesizer and an optical frequency synthesizing method using femtosecond laser optical injection locking, which inject a femtosecond laser optical frequency comb into a diode laser, thus obtaining single-mode laser light, phase-locked to only a single mode in the optical frequency comb, and which change the optical frequency and interval, that is, the repetition rate, of a femtosecond laser, together with the frequency of a semiconductor laser, thus enabling optical frequencies to be scanned while realizing a single desired optical frequency.

In order to accomplish the above object, the present invention provides an optical frequency synthesizer using femtosecond laser optical injection locking, comprising a mode-locked femtosecond laser, which is a master laser, and a diode laser, which is a slave laser and into which laser light emitted from the femtosecond laser is injected.

The diode laser may be a Distributed-Bragg Reflector (DBR) laser or a Distributed Feedback (DFB) laser.

The optical frequency synthesizer may further comprise a beam splitter for splitting laser light emitted from the femtosecond laser which is the master laser such that 5 to 15% of total laser light emitted from the femtosecond laser is used for optical injection locking, and the remaining laser light is used to stabilize $f_{ceo}$ and to control $f_{rep}$.

The femtosecond laser may further comprise a photonic crystal fiber for extending an optical spectrum.

The optical frequency synthesizer may further comprise a microwave frequency synthesizer for performing synchronization to obtain laser light having a desired optical frequency.

The optical frequency synthesizer may further comprise an interference filter for causing only a component of the optical frequency comb near an oscillation wavelength of the diode laser, which is the slave laser, to be injected while the laser light emitted from the femtosecond laser passes through the interference filter.

The optical frequency synthesizer may be configured such that, after the laser light emitted from the femtosecond laser, which is the master laser, passes through the interference filter, the laser light is injected into the diode laser, which is the slave laser, via a half-wavelength plate and a Polarizing Beam Splitter (PBS), thus adjusting intensity of the laser light.

Further, the present invention provides an optical frequency synthesizing method using femtosecond laser optical injection locking, wherein a mode-locked femtosecond laser is used as a master laser, and a diode laser, which oscillates in a single mode, is used as a slave laser, so that the laser light of the master laser is injected into the slave laser, and single mode laser light phase-locked only to a single mode of a frequency comb of the femtosecond laser, which is a master laser, is acquired, wherein an interval (repetition rate) of the optical frequency comb of the femtosecond laser is changed together with frequency of the diode laser, thus obtaining laser light enabling scanning of optical frequencies.

The frequency of optical injection-locked laser light emitted from the femtosecond laser, which is a master laser, is adjusted to a desired optical frequency by changing the frequency of the microwave frequency synthesizer. In this case, the frequency of the diode laser, which is a slave laser, is changed by changing the current that is supplied to the diode laser, thus consequently obtaining laser light having a desired frequency while maintaining an optical injection-locked state. In this case, the frequency of the femtosecond laser is changed by changing the interval (repetition rate) of the optical frequency comb of the femtosecond laser, thus enabling scanning to be performed.

The laser light emitted from the femtosecond laser, which is the master laser, passes through an interference filter, thus causing only a component of the optical frequency comb near an oscillation wavelength of the diode laser, which is the slave laser, to be injected.

Accordingly, the optical frequency synthesizer and optical frequency synthesizing method using femtosecond laser optical injection locking of the present invention is advantageous in that laser light, obtained from a mode-locked femtosecond laser, is injected into a diode laser, thus obtaining single-mode laser light, phase-locked only to a single mode in the optical frequency comb of a mode-locked femtosecond laser, and in that the optical frequency and interval, that is, the repetition rate, of laser light emitted from the femtosecond laser is changed together with the frequency of a semiconductor laser, thus enabling optical frequencies to be scanned.

DETAILED DESCRIPTION OF THE INVENTION

Figure 7:
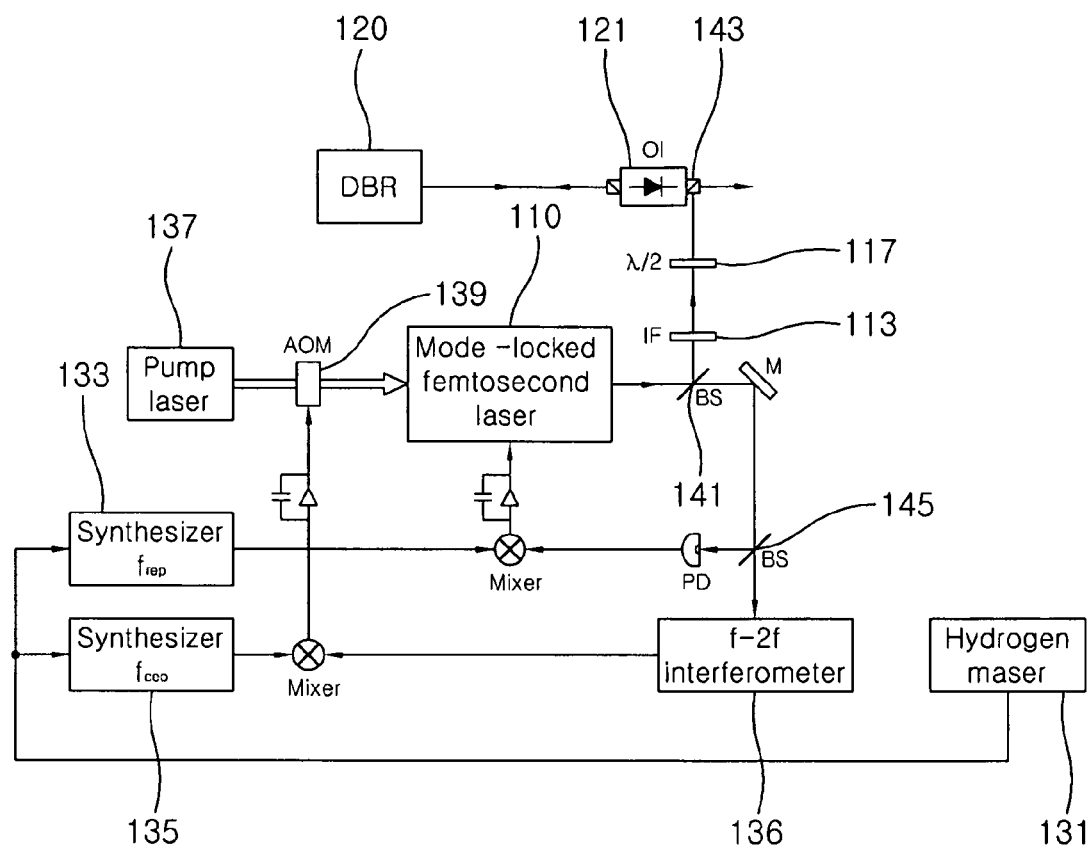
FIG. 7 is a diagram showing the construction of an optical frequency synthesizer according to an embodiment of the present invention.

The embodiment of FIG. 7 illustrates the connection of an $f_{ceo}$ adjustable microwave frequency synthesizer 135, connected to a hydrogen maser 131, and a $f_{rep}$ adjustable microwave frequency synthesizer 133, through a detailed example.

The construction in which an Acousto-Optic Modulator (AOM) 139, a pump laser 137, the $f_{ceo}$ adjustable microwave frequency synthesizer 135, and the $f_{rep}$ adjustable microwave frequency synthesizer 133 are arranged near the femtosecond laser and the diode laser, is depicted. The femtosecond laser 110 is connected to the pump laser 137 through the AOM 139. The femtosecond laser 110 is synchronized with the $f_{rep}$ adjustable microwave frequency synthesizer 133 to adjust the repetition rate of the femtosecond laser by adjusting the output signal frequency $f_{rep}$ of the $f_{rep}$ adjustable microwave frequency synthesizer 133.

Laser light emitted from the femtosecond laser 110 is split by a beam splitter 141, so that, for example, 5 to 15% of the laser light is used for optical injection locking, and the remaining laser light is split again using a separate beam splitter 145 and is used to stabilize $f_{ceo}$ and to adjust $f_{rep}$. In this case, when the amount of laser light injected into the diode laser through optical injection locking is excessively small, that is, less than 5%, the output of the optical frequency synthesizer according to the present invention may become excessively low, and may make the oscillation and driving of the diode laser difficult. When the amount of laser light is too large, the laser light may damage the diode laser, or may make single-mode optical injection locking difficult, thus causing multi-mode oscillation.

In this case, $f_{ceo}$ is stabilized using an f-2f method (an f-2f interferometer: 136), and $f_{rep}$ is phase-locked to cause the frequency thereof to be identical to the output signal frequency $f_{syn}$ of the microwave frequency synthesizer 133, synchronized with the hydrogen maser 131, which is a reference clock, or a Cesium atomic clock. That is, $f_{rep}$ can be considered to be the output signal frequency itself of the $f_{rep}$ adjustable microwave frequency synthesizer 133. Since the n-th mode frequency of the femtosecond laser optical frequency comb is $n \times f_{syn} \pm f_{ceo}$, laser light having a desired optical frequency can be created in such a way that the frequency of the optical injection-locked laser light is adjusted by changing the frequency $f_{syn}$ of the microwave frequency synthesizer. Further, the frequency of the diode laser 120 is also adjusted by changing the current of the diode laser 120 to such an extent that the frequency of the optical frequency comb is shifted, thus always maintaining an injection-locked state.

Hereinafter, embodiments of the present invention will be described in detail with reference to the attached drawings.

Figure 1:
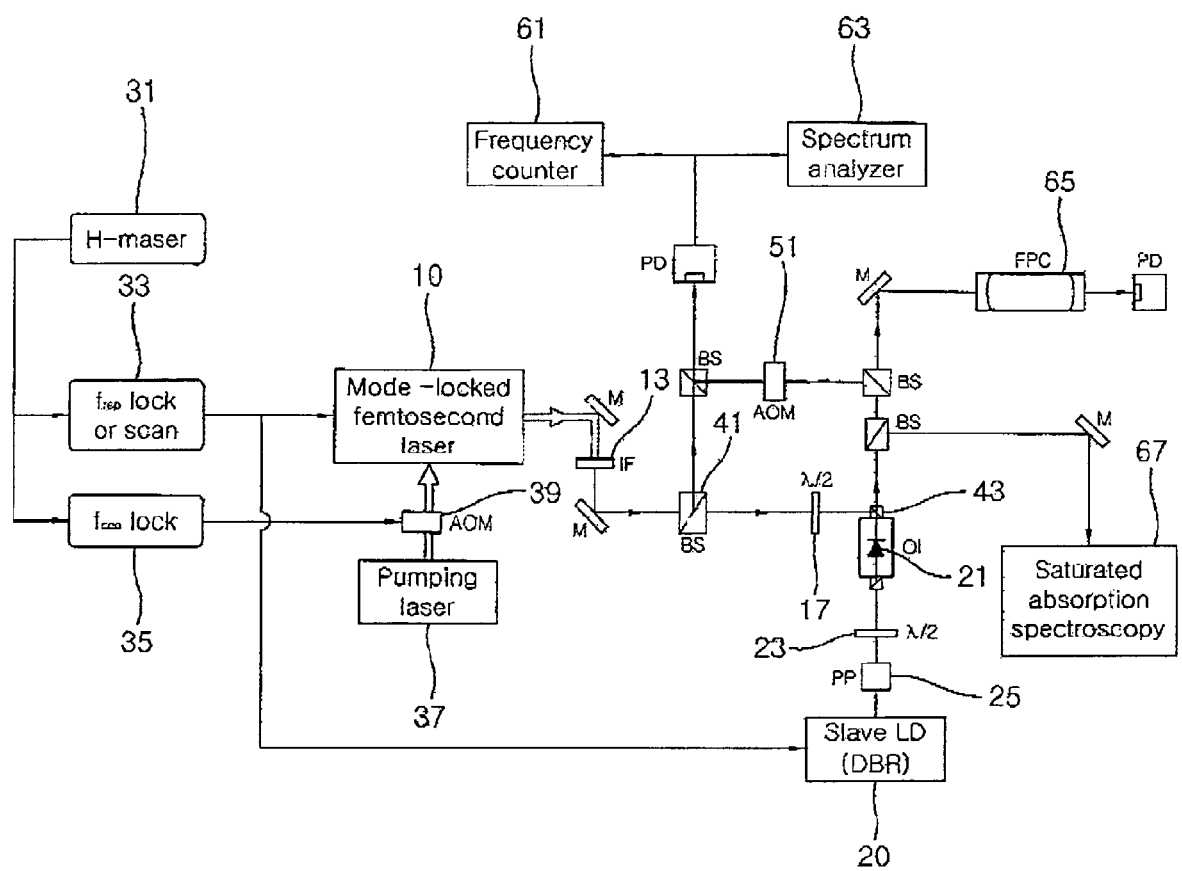
FIG. 1 is a diagram showing the construction of an optical frequency synthesizer using femtosecond laser optical injection locking according to an embodiment of the present invention, and an experimental apparatus provided to detect the characteristics thereof.

FIG. 1 is a diagram showing the construction of an optical frequency synthesizer using femtosecond laser optical injection locking according to an embodiment of the present invention and an experimental apparatus provided to detect the characteristics thereof. A femtosecond laser 10 and a Distributed Bragg Reflector (DBR), which is a diode laser 20, are provided, and an interference filter 13, half wavelength plates (λ/2 plates) 17 and 23, Beam Splitters (BSs) 41 and 43, and an optical isolator 21 are selectively arranged therebetween.

The repetition rate of the femtosecond laser 10, which is a master laser, is 1.05 GHz, and, in this case, the modes of an optical frequency comb are arranged at regular intervals of 1.05 GHz, the center wavelength thereof is 830 nm, and the spectrum thereof ranges over about 30 nm. The power of the pump laser 37, having a wavelength of 532 nm, is 5.5 W, and the power of the mode-locked femtosecond laser 10 that is obtained is about 700 mW. At this time, laser light having a power of about 60 mW is split from the total laser light by the beam splitter and is used for optical injection locking, and the remaining laser light is used to stabilize the output signal frequency $f_{ceo}$ of an $f_{ceo}$ adjustable microwave frequency synthesizer 35, synchronized with a hydrogen maser 31, which is a basic clock, and to adjust the output signal frequency $f_{rep}$ of an $f_{rep}$ adjustable microwave frequency synthesizer 33, which participates in the adjustment of the repetition rate of the femtosecond laser optical frequency comb. The diode laser 20, which is optical injection-locked to the femtosecond laser 10, which is the master laser, is implemented using a Distributed-Bragg Reflector (DBR) laser or a Distributed FeedBack (DFB) laser, having an oscillation wavelength of 852 nm and a maximum power of 150 mW, and its own oscillation line width is about 5 MHz. In order to inject only the components of the optical frequency comb near the oscillation wavelength of the diode laser 20, which is a slave laser, the interference filter 13, having a center wavelength of 852.3 nm and a bandwidth of 1.5 nm, is used. After laser light of about 60 mW from the femtosecond laser passes through the interference filter 13, the power of the laser light is about 0.2 mW, and is adjusted using the half-wavelength (λ/2) plate 17 and a Polarizing Beam Splitter (PBS) 43 before being injected into the diode laser 20, which is a slave laser. Reference numeral 25 in FIG. 1 denotes an anamorphic Prism Pair (PP), M denotes a mirror, BS denotes a beam splitter, and a PD denotes a photodetector. In order to observe the phase locking characteristics of the injection-locked diode laser 20, the frequency of the diode laser 20 is shifted by 80 MHz using an Acousto-Optic Modulator (AOM) 51, and then the beat frequency between the shifted frequency and the corresponding mode frequency of the optical frequency comb of the femtosecond laser 10 is observed using both a frequency counter 61 and a spectrum analyzer 63. Further, oscillation in a single mode is observed using a confocal Fabry-Perot resonator 65, having a free spectral range of 10 GHz.

Moreover, the above-described femtosecond laser 10, which is the master laser, may include a photonic crystal fiber (not shown) for extending the optical spectrum.

Figure 2:
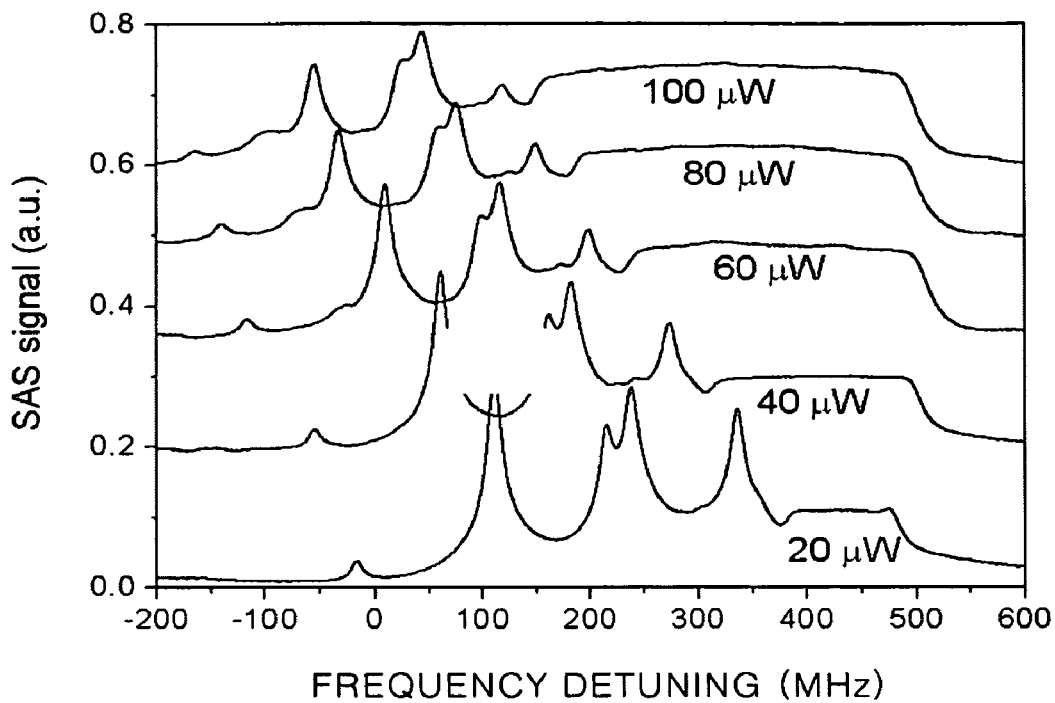
FIG. 2 is a graph showing the saturated absorption spectrum of Cesium, obtained by changing the intensity of an injected optical frequency comb.
Figure 3:
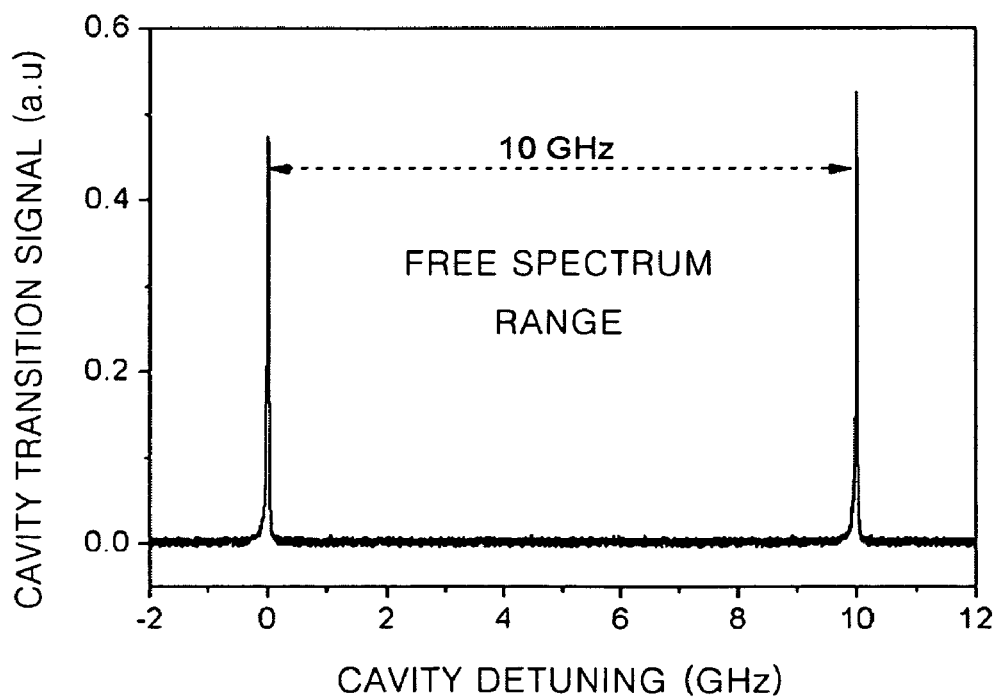
FIG. 3 is a graph showing an injection-locked diode laser spectrum observed using a signal passing through a confocal Fabry-Perot resonator.

FIGS. 2 and 3 illustrate graphs showing the saturated absorption spectrum of Cesium, obtained by changing the intensity of an injected optical frequency comb. This shows the results obtained by measuring the injection-locking range of the diode laser relative to the intensity of the injected optical frequency comb while observing saturated absorption spectrum signals corresponding to excited states F'=3, 4, and 5 from a ground state F=4 on a Cesium D2 transition line. First, the saturated absorption spectrum signals are observed while the frequency of laser light is shifted by changing current that is supplied to the diode laser. In this case, when the femtosecond laser frequency comb is injected into the diode laser, the frequency of the diode laser is identical to a specific mode frequency of the femtosecond laser when the frequency of the diode laser approaches the specific mode frequency of the femtosecond laser frequency comb. In this injection locking range, the intensity of the saturated absorption spectrum signals is not changed. Referring to FIG. 2, it can be seen that, as the intensity of injected light increases, the injection locking range is widened. Since it is actually difficult to know the intensity of the optical frequency comb connected to the diode laser, the intensity of injected light in FIG. 2 denotes the intensity of the optical frequency comb incident on the diode laser. When the intensity of injected light is about 40 μW, the injection locking range is measured to be about 200 MHz.

It can be seen that, when the optical frequency comb is injected, the oscillation frequency of the diode laser, which is a slave laser, decreases. The reason for this is that the injected light changes the carrier density of the diode laser, which changes the refractive index. Therefore, as shown in FIG. 2, as the intensity of injected light increases, the frequency shift increases. The results, obtained by observing the spectrum of the diode laser using a signal passing through the confocal Fabry-Perot resonator when the diode laser is in an injection-locked state, are shown in FIG. 3. It can be seen from the results of FIG. 3 that the diode laser oscillates in a single mode.

Figure 4:
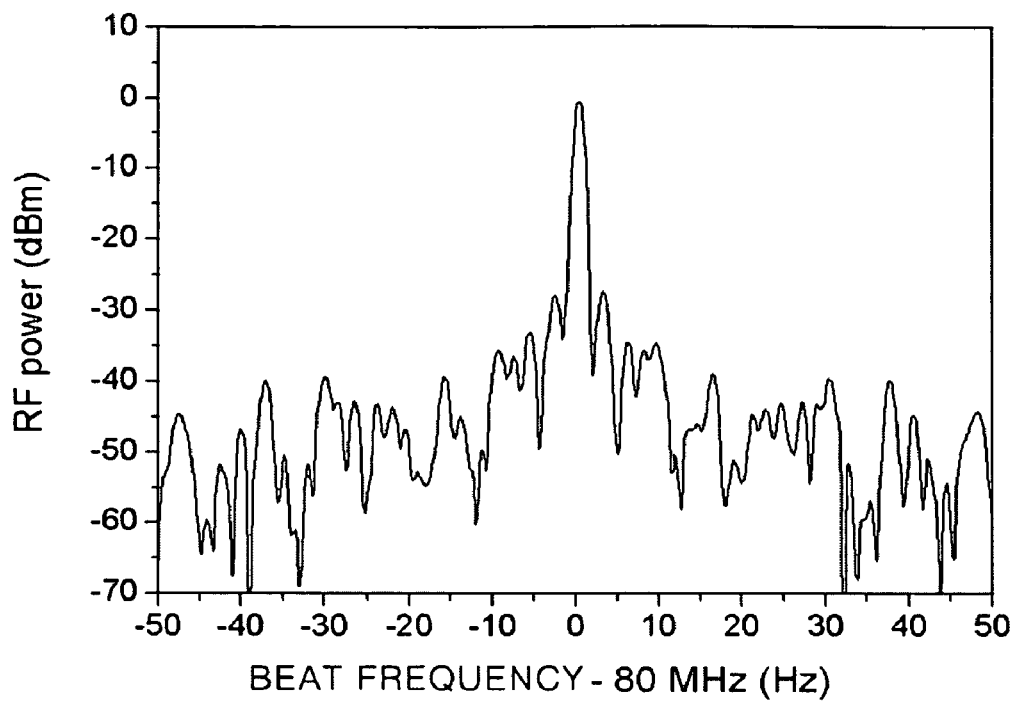
FIG. 4 is a graph showing the beat spectrum between an optical injection-locked diode laser and an optical frequency comb.
Figure 5:
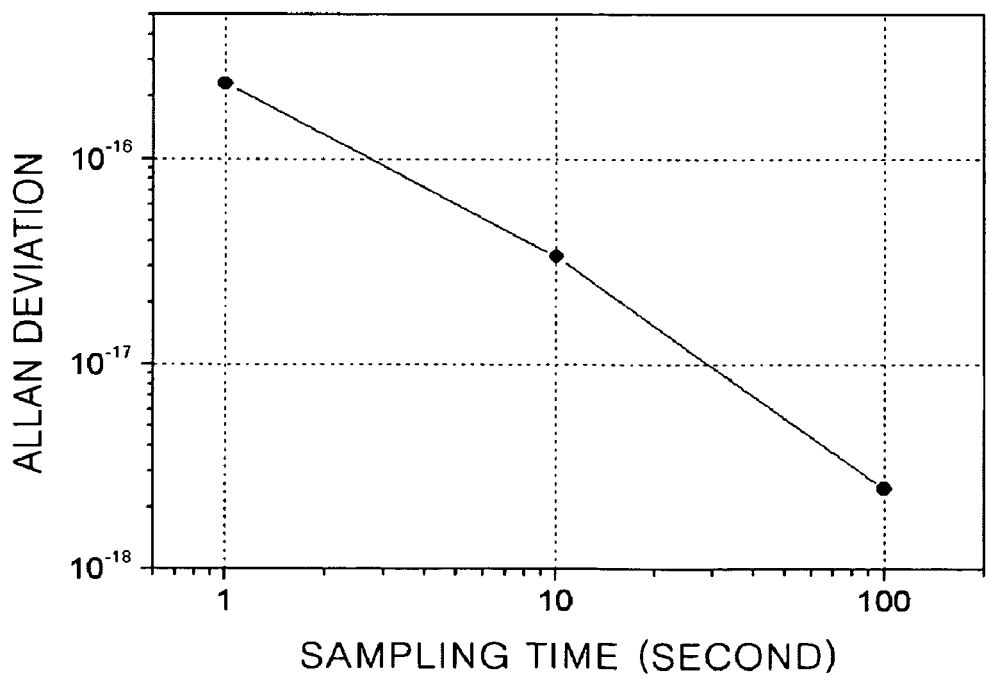
FIG. 5 is a graph showing frequency stability between an optical injection-locked diode laser and an optical frequency comb.

FIGS. 4 and 5 are graphs showing the beat frequency spectrum between an optical injection-locked diode laser and an optical frequency comb and the frequency stability thereof.

The degree to which the frequency and characteristics of the injection-locked diode laser are coincident with those of a single component (mode) of the injected optical frequency comb, that is, traceability, is measured, and the results of measurement are shown in FIGS. 4 and 5. FIG. 4 illustrates the results obtained by measuring the beat frequency between the frequency of the optical injection-locked diode laser and the optical frequency comb using a spectrum analyzer when the frequency of the optical injection-locked diode laser is shifted by 80 MHz using an Acousto-Optic Modulator (AOM), and is then spatially incident to that of the optical frequency comb. The center frequency thereof is measured as a value identical to a Radio Frequency (RF) of 80 MHz, injected into the acousto-optic modulator, and the line width thereof is measured to be the resolution limit of the spectrum analyzer. In order to measure the frequency stability between the diode laser and the optical frequency comb, the beat frequency is measured using the frequency counter, and the results of measurement are shown in FIG. 5 in the form of an Allan deviation. The traceability between the single mode of the optical frequency comb and the diode laser for an integral time of 1 second is $3.5*10^{16}$, and the average frequency is measured as a value higher than 80 MHz by 1.75 MHz, which is the driving frequency of the acousto-optic modulator. On the basis of these results, it can be determined that the characteristics of the optical injection-locked diode laser are precisely identical to those of the optical frequency comb.

Therefore, when the frequency of the optical frequency comb of the femtosecond laser is changed while the diode laser is maintained in the optical injection-locked state, laser light having an arbitrary single-mode optical frequency can be output through the diode laser. Therefore, an entire structure of the laser diode and the femtosecond laser functions as a single optical frequency synthesizer. When the frequencies of the optical frequency comb are shifted at regular intervals, an optical frequency synthesizer enabling scanning can be realized.

Figure 6:
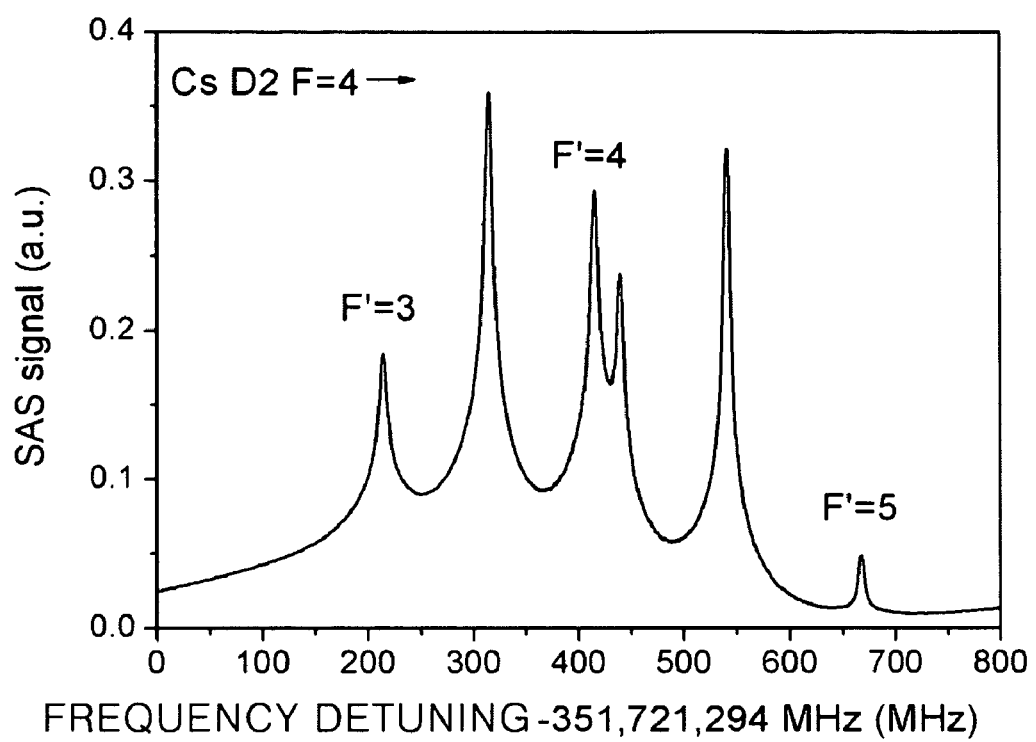
FIG. 6 is a graph showing a saturated absorption spectrum corresponding to excited states (F'=3, 4, and 5) from a ground state (F=4) on a Cesium D2 transition line, observed from a Cesium vapor cell using an optical frequency synthesizer according to the present invention.

FIG. 6 illustrates a saturated absorption spectrum signal obtained by changing the output frequency of a microwave frequency synthesizer, in which the X axis denotes the absolute frequency of an optical injection-locked diode laser.

In FIG. 6, a graph, showing saturated absorption spectrum signals corresponding to excited states (F'=3, 4, and 5) from a ground state (F=4) on a Cesium D2 transition line observed from a Cesium vapor cell using an optical frequency synthesizer according to the present invention, is depicted. That is, FIG. 6 shows the results obtained by generating the optical frequency synthesizer of the embodiment of FIG. 7 through the above-described method, and by applying the optical frequency synthesizer to the observation of the saturated absorption spectrum signals of Cesium atoms.

What is claimed is:
1. An optical frequency synthesizer, comprising:
A mode-locked femtosecond laser, which is a master laser;
A diode laser, which is a slave laser and a laser light emitted from the mode-locked femtosecond laser is injected into the diode laser; and
a microwave frequency synthesizer for adjusting an output signal frequency $f_{rep}$ thereof, wherein the mode-locked femtosecond laser is synchronized with the $f_{rep}$ adjustable microwave frequency synthesizer, and is configured to change frequency thereof using the frequency

$f_{rep}$, and wherein the frequency of the laser light, which is output from the diode laser, is changed by changing the frequency $f_{rep}$.

2. The optical frequency synthesizer according to claim 1, wherein the diode laser is one of a Distributed-Bragg Reflector (DBR) laser and a Distributed Feedback (DFB) laser.

3. The optical frequency synthesizer according to claim 1, further comprising an Acousto-Optic Modulator (AOM), a pump laser, and an $f_{ceo}$ adjustable microwave frequency synthesizer, wherein the mode-locked femtosecond laser is connected to the pump laser through the AOM, wherein the AOM is configured to be adjusted by the $f_{ceo}$ adjustable microwave frequency synthesizer, which is stabilized through an f-2f interferometer, and wherein the optical frequency synthesizer further comprises a beam splitter for splitting laser light emitted from the femtosecond laser such 5% to 15% of laser light emitted from the femtosecond laser is used for optical injection locking, and a part of remaining laser light is used to stabilize $f_{ceo}$.

4. The optical frequency synthesizer according to claim 1, wherein the mode-locked femtosecond laser further comprises a photonic crystal fiber for extending an optical spectrum.

5. The optical frequency synthesizer according to claim 1, further comprising an interference filter for causing a component of the optical frequency comb near an oscillation wavelength of the diode laser, to be injected while the laser light emitted from the mode-locked femtosecond laser passes through the diode laser.

6. The optical frequency synthesizer according to claim 5, wherein the optical frequency synthesizer is configured such that, after the laser light emitted from the mode-locked femtosecond laser, passes through the interference filter, the laser light is injected into the diode laser, via a half-wavelength plate and a Polarizing Beam Splitter (PBS) to adjust an intensity of the laser light.

7. An optical frequency synthesizing method, wherein:
a mode-locked femtosecond laser is used as a master laser, and a diode laser, which oscillates in a single mode, is used as a slave laser, so that the master laser is injected into the slave laser, and single mode laser light phase-locked to a single mode of a frequency comb of the mode-locked femtosecond laser, is acquired, wherein a repetition rate of the optical frequency comb of the femtosecond laser is changed together with a frequency of the diode laser, wherein a frequency of optical injection-locked laser light emitted from the mode-locked femtosecond laser is adjusted by changing a frequency of a microwave frequency synthesizer, wherein the frequency of the optical injection-locked laser light is changed by changing a frequency $f_{rep}$.

8. The optical frequency synthesizing method according to claim 7, wherein the diode laser is one of a Distributed-Bragg Reflector (DBR) laser and a Distributed Feedback (DFB) laser.

9. The optical frequency synthesizing method according to claim 7, wherein laser light emitted from the mode-locked femtosecond laser is split, so 5% to 15% of laser light emitted from the mode-locked femtosecond laser is used for optical injection locking, and a part of remaining laser light is used to stabilize $f_{ceo}$.

10. The optical frequency synthesizing method according to claim 7, wherein the mode-locked femtosecond laser, further comprises a photonic crystal fiber for extending an optical spectrum.

11. The optical frequency synthesizing method according to claim 7, wherein the laser light emitted from the mode-locked femtosecond laser, passes through an interference filter, thus causing a component of the optical frequency comb near an oscillation wavelength of the diode laser, to be injected.

12. The optical synthesizing method according to claim 7, wherein a frequency of laser light emitted from the diode laser, is changed by changing a current that is supplied to the diode laser when an interval of the optical frequency comb of the mode-locked femtosecond laser is changed, while an optical injection-locked state between the mode-locked femtosecond laser and the diode laser is maintained.

13. The optical frequency synthesizing method according to claim 11, wherein, after the laser light emitted from the mode-locked femtosecond laser, passes through the interference filter, the laser light is injected to the diode laser, via a half-wavelength plate and a polarizing beam splitter.

* * * * *